United States Patent
Park et al.

(10) Patent No.: US 9,036,398 B2
(45) Date of Patent: May 19, 2015

(54) VERTICAL RESISTANCE MEMORY DEVICE AND A READ METHOD THEREOF

(71) Applicant: SAMSUNG ELECTRONICS CO., LTD., Suwon-si, Gyeonggi-do (KR)

(72) Inventors: Jintaek Park, Gyeonggi-do (KR); Youngwoo Park, Seoul (KR); Jungdal Choi, Gyeonggi-do (KR)

(73) Assignee: Samsung Electronics, Co., Ltd., Suwon-si, Gyeonggi-do (KR)

( * ) Notice: Subject to any disclaimer, the term of this patent is extended or adjusted under 35 U.S.C. 154(b) by 17 days.

(21) Appl. No.: 13/708,018

(22) Filed: Dec. 7, 2012

(65) Prior Publication Data

US 2013/0223127 A1    Aug. 29, 2013

(30) Foreign Application Priority Data

Feb. 27, 2012    (KR) .................. 10-2012-0019764

(51) Int. Cl.
   *G11C 11/00*    (2006.01)
   *G11C 11/21*    (2006.01)
   *G11C 13/00*    (2006.01)

(52) U.S. Cl.
   CPC .............. *G11C 11/21* (2013.01); *G11C 13/00* (2013.01)

(58) Field of Classification Search
   CPC . G11C 13/0004; G11C 16/26; G11C 2213/71
   USPC ................................ 365/148, 158
   See application file for complete search history.

(56) References Cited

U.S. PATENT DOCUMENTS

| | | | |
|---|---|---|---|
| 7,009,278 B2 | 3/2006 | Hsu | |
| 7,342,824 B2 | 3/2008 | Hsu | |
| 7,408,212 B1* | 8/2008 | Luan et al. | 257/295 |
| 7,701,747 B2 | 4/2010 | Park et al. | |
| 7,835,174 B2 | 11/2010 | Tokiwa | |
| 7,843,715 B2 | 11/2010 | Park et al. | |
| 7,952,917 B2 | 5/2011 | Xi et al. | |
| 8,027,194 B2 | 9/2011 | Lee et al. | |
| 2004/0004856 A1* | 1/2004 | Sakimura et al. | 365/158 |
| 2008/0112209 A1* | 5/2008 | Cho et al. | 365/148 |
| 2008/0175035 A1* | 7/2008 | Taguchi | 365/148 |
| 2010/0082890 A1 | 4/2010 | Heo et al. | |
| 2011/0031467 A1* | 2/2011 | Kubo et al. | 257/5 |
| 2011/0299314 A1* | 12/2011 | Samachisa et al. | 365/51 |

* cited by examiner

FOREIGN PATENT DOCUMENTS

| KR | 1020080064369 A | 7/2008 |
|---|---|---|
| KR | 1020080069313 A | 7/2008 |
| KR | 1020090125341 A | 12/2009 |

*Primary Examiner* — Anthan Tran
(74) *Attorney, Agent, or Firm* — F. Chau & Associates, LLC

(57) ABSTRACT

A read method of a vertical resistance memory device including resistance memory cells arranged in a three-dimensional array includes selecting a block from a plurality of blocks, applying a read voltage to a word line selected from word lines of the block, applying a sensing reference voltage to bit lines sharing the plurality of blocks, applying a string selection voltage to a string selection transistor through a string selection line selected from a plurality of string selection lines of the block, wherein the string selection line is connected to a gate of the string selection transistor; and determining a memory state of a memory cell selected from the plurality of resistance memory cells by the word line and the string selection line based on a current flowing through the memory cell, wherein the word line is connected through a corresponding horizontal electrode to the memory cell.

11 Claims, 11 Drawing Sheets

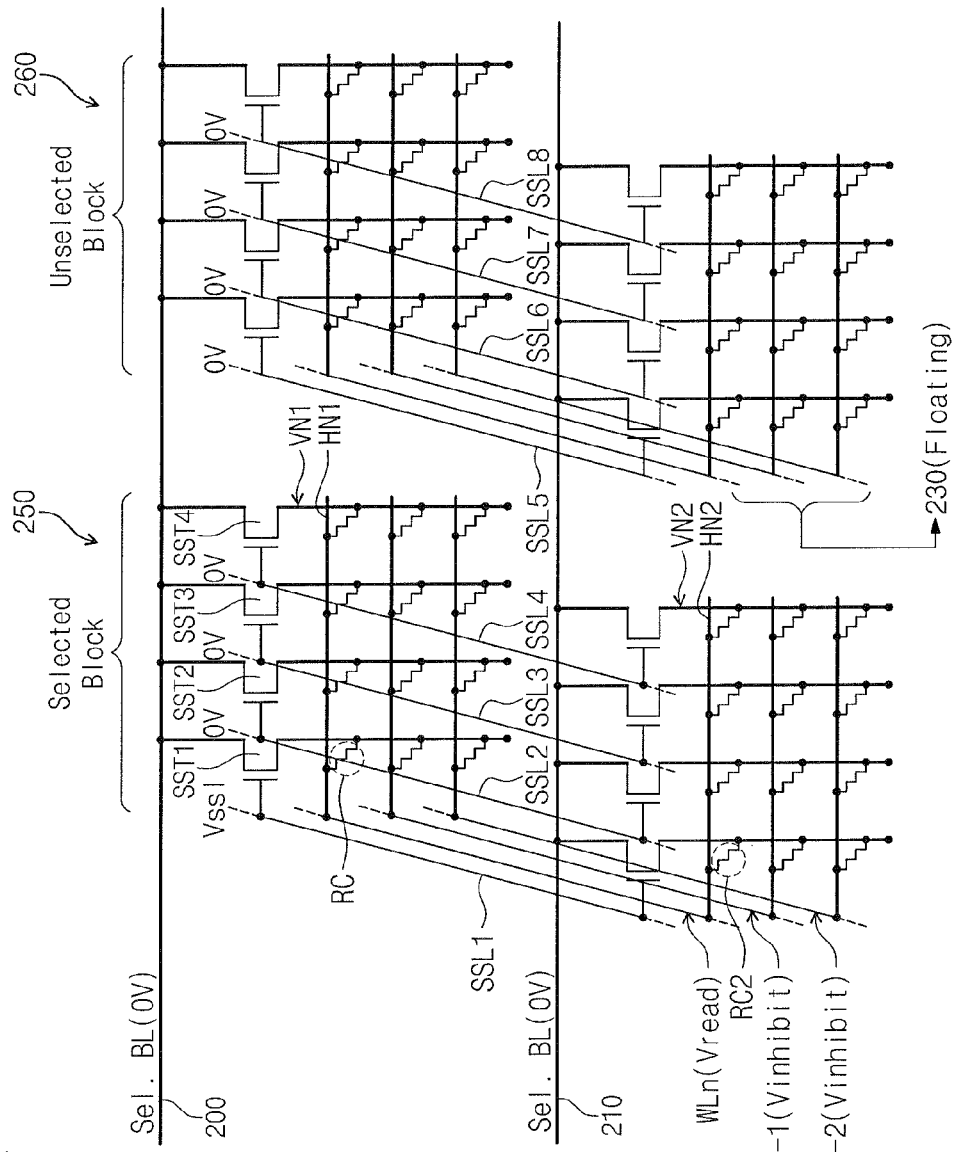

VERTICAL RESISTANCE MEMORY DEVICE AND A READ METHOD THEREOF

CROSS-REFERENCE TO RELATED APPLICATIONS

A claim for priority under 35 U.S.C. §119 is made to Korean Patent Application No. 10-2012-0019764 filed Feb. 27, 2012, in the Korean Intellectual Property Office, the entire contents of which are incorporated by reference herein in its entirety.

TECHNICAL FIELD

The inventive concepts described herein relate to a vertical resistance memory device and a read method of the vertical resistance memory device.

DISCUSSION OF THE RELATED ART

As a nonvolatile memory device, the flash memory (e.g., a NAND flash memory) provides a high density, nonvolatile solution for computer or mobile applications.

Recently, Non-volatile memory devices such as a phase random access memory (PRAM), a magnetic RAM (MRAM), and a resistance RAM (ReRAM) have been proposed for a three dimensional storage application. For three-dimensional storage applications of new non-volatile memory devices, especially, ReRAM, an efficient read operation method is demanded.

SUMMARY

In one embodiment of a read method of a vertical resistance memory device including a plurality of resistance memory cells arranged in a three-dimensional array, the method includes a step of selecting a block from a plurality of blocks, a step of applying a read voltage to a word line selected from word lines of the block, a step of applying a sensing reference voltage to bit lines sharing the plurality of blocks, a step of applying a string selection voltage to a string selection transistor through a string selection line selected from a plurality of string selection lines of the block, wherein the string selection line is connected to a gate of the string selection transistor; and a step of determining a memory state of a resistance memory cell selected from the plurality of resistance memory cells by the word line and the string selection line based on a current flowing through the resistance memory cell, wherein the word line is connected through a corresponding horizontal electrode to the resistance memory cell.

The resistance memory cell includes a variable resistance element having a set state or a reset state determined according to an amount of current flowing through the variable resistance element. The resistance memory cell also includes a diode between the corresponding horizontal electrode and a corresponding vertical electrode. The word lines are formed at a plurality of layers disposed over each other, respectively, and vertical electrodes are disposed in a direction perpendicular to the plurality of layers. The plurality of resistance memory cells are programmed by a page unit, the page being formed of resistance memory cells connected to a word line and the bit lines. String selection transistors in an unselected block of the plurality of blocks turn off. Word lines of the unselected block are floated. The read-inhibition voltage is half a read voltage. The sensing reference voltage is 0V.

In still another embodiment, the plurality of resistance memory cells are programmed by a page unit, the page being formed of resistance cells connected to a word line and a part of the bit lines.

In still another embodiment, the step of applying a string selection voltage sequentially is performed to all of the plurality of string selection lines of the block.

In still another embodiment, the step of applying a read voltage sequentially is performed to all of the plurality of word lines of the block.

In still another embodiment, the read method also includes a step of providing the read-inhibition voltage to other bit lines of the bit lines.

In another embodiment of a read method of a vertical resistance memory device which includes a plurality of strings each having a plurality of resistance cells connected between horizontal electrodes corresponding to word lines and a vertical electrode and a string selection transistor connecting the vertical electrode and a corresponding bit line, the method includes a step of setting up word lines and bit lines by providing a read voltage to a selected word line from the word lines and a read-inhibition voltage to unselected word lines from the word lines and bit lines, a step of selecting a string by turning on a string selection transistor having a resistance cell to be read, and a step of applying a sensing reference voltage to the bit lines.

In still another embodiment, the step of selecting a string includes a step of providing a string selection voltage to a string selection line connected to a string selection transistor.

In one embodiment, a vertical resistance memory device includes a plurality of bit lines, a plurality of word lines connected to a plurality of horizontal electrodes, respectively, a plurality of string selection transistors electrically connecting each of the plurality of bit lines and the plurality of vertical electrodes, respectively, a plurality of resistance memory cells connected between the plurality of horizontal electrodes and the plurality of vertical electrodes, respectively, and a control logic configured to control a X-decoder and a page buffer and Y-decoder for reading the plurality of resistance memory cells in a string direction or in a word line direction by a page, wherein the X-decoder selects one of the plurality of word lines and the page buffer and Y-decoder selects one of the bit lines.

In another embodiment, the plurality of horizontal electrodes are formed at a plurality of layers disposed over each other, and vertical electrodes run perpendicular to the plurality of layers. The plurality of resistance memory cells includes a variable resistance element having a set state or a reset state determined according to an amount of current flowing through the variable resistance element when a corresponding string selection transistor turns on.

In another embodiment, the page is formed of resistance memory cells connected to one of the plurality of word lines and a part of the plurality of bit lines.

In another embodiment, the page is formed of resistance memory cells connected to one of the plurality of word lines and the plurality of bit lines.

BRIEF DESCRIPTION OF THE FIGURES

The above and other objects and features will become apparent from the following description with reference to the following figures, wherein like reference numerals refer to like parts throughout the various figures unless otherwise specified, and wherein

FIGS. 4A and 4B are schematic diagrams for illustrating a sequence of performing in a string direction a read operation by an ABL (All Bit Line)-structured page.

DETAILED DESCRIPTION

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art.

Figure 1:
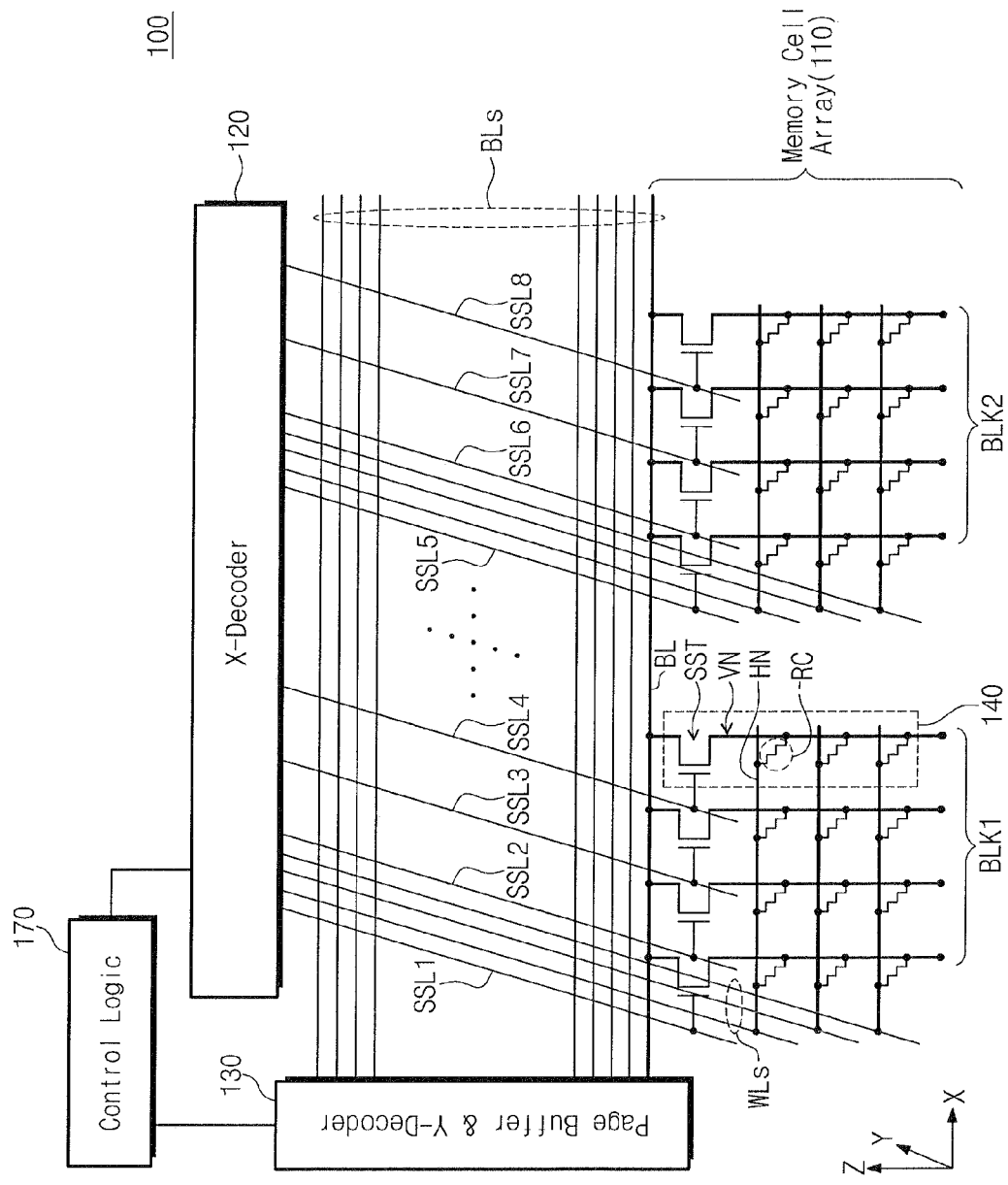
FIG. 1 is a schematic diagram for illustrating a vertical resistance memory device according to an embodiment of the inventive concept.

FIG. 1 is a schematic diagram for illustrating a vertical resistance memory device according to an embodiment of the inventive concept. Referring to FIG. 1, a vertical resistance memory device 100 may include a memory cell array 110, a row decoder (hereinafter, referred to as an X-decoder) 120, and a page buffer and column decoder block (hereinafter, referred to as a page buffer and Y-decoder block) 130.

The memory cell array 110 may be a three-dimensional array, partitioned into a plurality of blocks BLK1 and BLK2. The blocks BLK1 and BLK2 may be partitioned along bit lines, sharing the bit lines BLs. For ease of description, only two blocks BLK1 and BLK2 are illustrated in FIG. 1. However, the inventive concept is not limited thereto. For example, the memory cell array 110 may be configured to include three or more blocks. Each of the blocks BLK1 and BLK2 may include a plurality of strings that are formed in a direction (e.g., a Z-direction) perpendicular to an XY plane. Directions X, Y, and Z may be perpendicular with one another. In FIG. 1, there is illustrated a block having four strings connected to a bit line. However, the inventive concept is not limited thereto. For example, a memory block may be configured such that a plurality of strings is connected to a bit line.

More specifically, the structure of a string 140 will be described below. A string 140 may include a string selection transistor SST and a plurality of resistance memory cells RC1 to RC3. The one end of the transistor SST may be connected to a bit line BL and the other end of the transistor SST may be connected to the plurality of resistance cells RC1 to RC3. The resistance cell RC1 may be connected between horizontal electrodes HN and a vertical electrode VN connected to the other end of the transistor SST. The horizontal electrode HN may be formed at different physical layers that are disposed over each other in a Z-direction, resulting in the memory cell array of a three-dimensional structure. The vertical electrodes VN may be disposed along a first direction (X). The vertical electrodes VN may be electrically connected to corresponding bit lines BLs via their corresponding string selection transistors SST, respectively. Each of the vertical electrodes VN may run in parallel to a third direction (Z).

A resistance memory cell RC1 may include a variable resistance element. Herein, a variable resistance element may include phase-change materials, transition metal oxides, ferroelectric materials, or magnetic materials. The vertical resistance memory device 100 according to an embodiment of the inventive concept is applicable to a phase-change RAM (PRAM), a resistance RAM (RRAM), a ferroelectric RAM (FRAM), or a magnetic RAM (MRAM) according to a material of a variable resistance element. The variable resistance element may have two memory states such as a set state and a reset state according to its resistance. For a set state, the variable resistance element may have a high resistance state (HRS). For a reset state, the variable resistance element may have a low resistance state (LRS). The memory state may be determined according to the amount of current supplied via a string selection transistor SST.

The string selection transistor SST may be used to determine whether a bit line BL is connected to a vertical electrode VN. When a string selection voltage Vssl applies to the gate of the transistor SST, the transistor SST turns on and the bit line BL is electrically connected to the vertical electrode VN. When 0V applies to the gate of the transistor SST, the transistor SST is in an off state and the bit line BL is electrically disconnected to the vertical electrode VN.

The X-decoder 120 may be connected to word lines WLs and string selection lines SSL1 to SSL8 of the memory blocks BLK1 and BLK2. The X-decoder 120 may select one of the blocks BLK1 and BLK2 in response to an address. When a block BLK1 is selected, word lines WLs and string selection lines SSL1 to SSL4 of the selected block BLK1 may be set to a predetermined bias condition for a read operation. When the string 140 is selected, a string selection voltage Vssl is provided to a string selection line SSL4 corresponding to the string 140. The string selection voltage Vssl may be a voltage necessary to turn on the string selection transistor SST.

The page buffer and Y-decoder block 130 may be connected to bit lines BLs. For a program operation, the page buffer and Y-decoder block 130 may receive data to be written to the memory cell array 110 from an external device and store it temporarily. For a read operation, the page buffer and Y-decoder block 130 may read data from the memory cell array 110 and store it temporarily. The page buffer and Y-decoder block 130 may select a specific number of bit lines based on an input address.

The vertical resistance memory device 100 may further include control logic 150 controlling the X-decoder 120 and the page buffer and Y-decoder block 130 for a read operation. The control logic may control the X-decoder 120 and the page buffer and Y-decoder block 130 to perform a read operation by a page.

In exemplary embodiments, a page may be formed of a plurality of resistance memory cells connected to a word line and all bit lines connected to the page buffer 130. In other exemplary embodiments, a page may be formed of a plurality of resistance memory cells connected to a word line and a part of all bit lines connected to the page buffer 130.

The control logic 170 may control the X-decoder 120 and the page buffer and Y-decoder block 130 to perform a read operation by a page. In exemplary embodiments, a read operation may be sequentially performed in a word line direction or a string direction.

Figure 2:
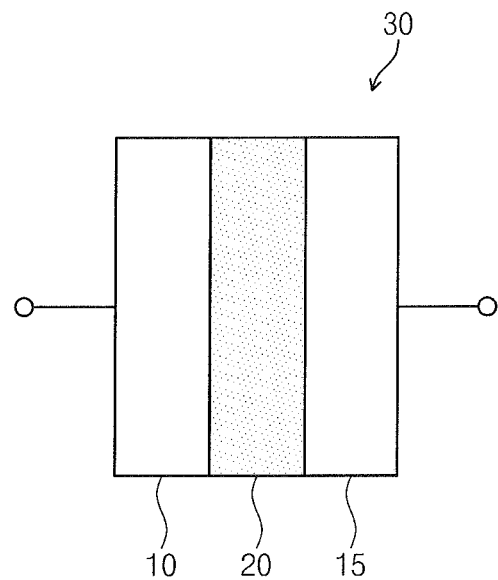
FIG. 2 is a schematic diagram for illustrating the structure of a variable resistance element structure of a resistance memory cell of FIG. 1.

FIG. 2 is a schematic diagram for illustrating the structure of a variable resistance element structure of a resistance memory cell of FIG. 1. Referring to FIG. 2, the variable resistance element may include a pair of electrodes 10 and 15 and a data storage film 20 interposed between the electrodes 10 and 15.

The electrodes 10 and 15 may be formed of metal, metallic oxide, or metallic nitride. The electrodes 10 and 15 may be formed of Al, Cu, TiN, TixAlyNz, Ir, Pt, Ag, Au, polycrystalline silicon, W, Ti, Ta, TaN, WN, Ni, Co, Cr, Sb, Fe, Mo, Pd, Sn, Zr, Zn, IrO2, StZrO3, or the like.

The data storage film 20 may be formed of a bipolar resistance memory material or a unipolar resistance memory material. The bipolar resistance memory material may be programmed to a set or reset state according to a polarity of a pulse. The unipolar resistance memory material may be programmed to a set or reset state by a pulse having the same polarity. The unipolar resistance memory substrate may include transient metal oxide such as NiOx or TiOx, and the bipolar resistance memory material may include materials having the perovskite crystal structure.

Figure 3A:
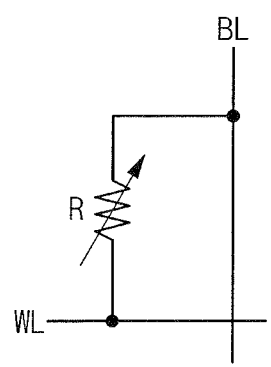
FIGS. 3A to 3D are schematic circuit diagrams for illustrating various structures of a resistance memory cell of FIG. 1.
Figure 3B:
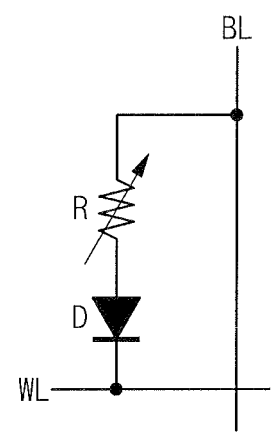
Figure 3C:
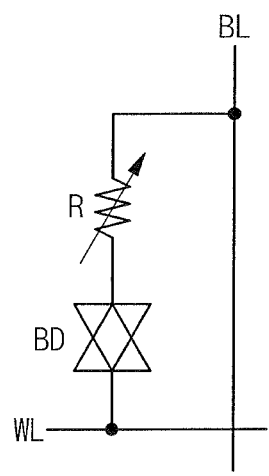
Figure 3D:
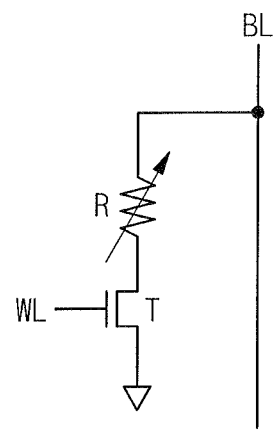

FIGS. 3A to 3D are schematic circuit diagrams for illustrating various structures of a resistance memory cell of FIG. 1. FIG. 3A illustrates a resistance memory cell not including a selection element. FIGS. 3B to 3D illustrate resistance memory cells including a selection element, respectively.

Referring to FIG. 3A, a resistance memory cell may include a variable resistance element R connected to a bit line BL and a word line WL. In a read operation, reading of data stored in a resistance memory cell may be performed by a voltage applied between the bit line BL and the word line WL.

Referring to FIG. 3B, a resistance memory cell may include a variable resistance element R and a diode D. The variable resistance element R may include a variable resistance material for storing data. The diode D may be disposed between the variable resistance element R and the word line WL. In another embodiment, the diode D may be disposed between the variable resistance element R and the bit line BL. In operation, the diode D may render a current path between the word line WL and the bit line BL conductive or non-conductive according to a bias condition of the word line WL and the bit line BL. The diode D may turn on or off according to a voltage difference between the word line WL and the bit line BL. Thus, the resistance memory cell R may not be driven when a specific voltage is provided to the word line WL (or an unselected word line) when the diode D is subject to a reverse bias condition. The bias condition will be further explained in FIG. 4A through FIG. 7.

Referring to FIG. 3C, a resistance memory cell may include a variable resistance element R and a bi-directional diode BD. The variable resistance element R may include a variable resistance material for storing data. The bi-directional diode BD may be connected between the variable resistance element R and the word line WL, and the variable resistance element R may be connected between the bit line BL and the b-directional diode BD. In another embodiment, the variable resistance element R may be connected between a word line WL and a bi-directional diode BD. The bi-directional diode BD may block a leakage current flowing to an unselected resistance memory cell.

Referring to FIG. 3D, a resistance memory cell may include a variable resistance element R and a transistor T. The transistor T may be connected between the variable resistance element R and the word line WL. In another embodiment, the transistor may be connected between the variable resistance element R and the bit line BL. In operation, the transistor T may selectively supply a current to the variable resistance element R according to a voltage of the word line WL. The resistance memory cell may be selected when the transistor T is turned on according to a voltage of the word line WL. The resistance memory cell may be unselected when the transistor T is turned off according to a voltage of the word line WL.

A structure of a resistance memory cell is not limited to this disclosure.

A read operation of a vertical resistance memory device 100 of the inventive concept will be described. A read operation may be performed by a page. According to the number of bit lines selected during a read operation, the memory device 100 may have an all bit line (ABL) architecture and a partial bit line (PBL) architecture. For an ABL architecture, a read operation by an ABL-sctructured page may select and sense each of cells connected between a word line and bit lines of a selected block. The ABL-structured page may include a plurality of resistance memory cells that are connected between all bit lines and a word line of a selected block. For a PBL architecture, a read operation by a PBL-structured page may select and sense a specific number of bit lines of a selected block. The PBL-structured page may include a plurality of resistance memory cells that are connected between a part of bit lines and a word line. Also, a read operation may be performed by a page in a string direction (in FIG. 1, a first direction (X)) or a word line direction (in FIG. 1, a third direction (Z)).

Figure 4B:
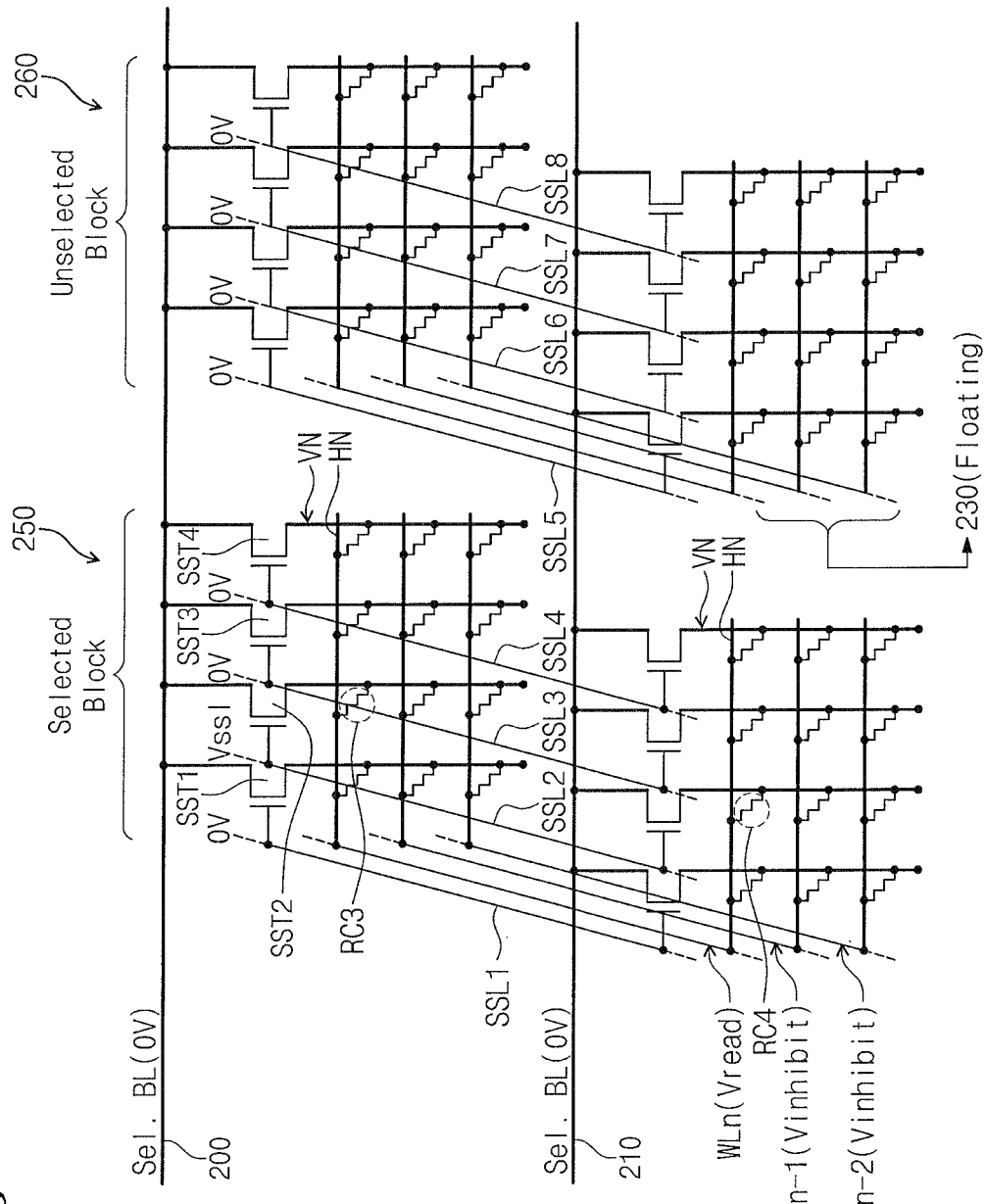

FIGS. 4A and 4B are schematic diagrams for illustrating a sequence of performing in a string direction a read operation by a ABL (All Bit Line)-structured page. For a read operation performed in a string direction, a plurality of string selection transistors SST1 to SST4 may be sequentially selected for a selected word line WLn. FIG. 4A shows a bias condition when a first string selection transistor SST1 is selected for the selected word line WLn. FIG. 4B shows a bias condition when a second string selection transistor SST2 is selected for the same selected word line WLn. For brevity of explanation, the first two operations will be explained. In a read operation performed in a string direction, the third and fourth selection transistors SST3 and SST4 may be sequentially selected under the same bias condition of FIG. 4A except that a string selection voltage Vssl may be applied to different string selection transistors.

Referring to FIG. 4A, in a read operation, states of resistance cells RC1 and RC2 may be read under a bias condition. The bias condition of a read operation is as follows. For a selected block 250, a read voltage Vread may be applied to a selected word line WLn while a read-inhibition voltage Vinhibit may be applied to the remaining word lines WLn-1 and WLn-2. A sensing reference voltage may be applied to all bit lines 200 and 210. While the selected block 250 is in a read operation, all word lines 230 of an unselected block 260 may be floated.

In exemplary embodiments, the read-inhibition voltage Vinhibit may be about half a read voltage Vread. The sensing reference voltage may be 0V. The read voltage Vread may be equal to or less than 3V. However, the read voltage Vread is not limited thereto.

Under the bias condition, a string selection voltage Vssl may be applied to a first string selection transistor SST1, resulting in conductive paths between the selected word line WLn and the bit lines 200 and 210 through the resistance memory cells RC1 and RC2, respectively. The memory cells RC1 and RC2 may be connected between horizontal lines HN1 and HN2 and vertical lines VN1 and VN2, respectively. The amounts of a current flowing through the current paths may be determined by memory states of the memory cells RC1 and RC2, respectively. The amount of a current may be sensed by a page buffer 130 of FIG. 1 connected to the bit lines 200 and 210. In exemplary embodiments, a string selection voltage Vssl may be 1V to 10V. However, the string selection voltage Vssl is not limited thereto.

Under the bias condition, 0V may be applied to the selected bit lines 200 and 210, resulting in a voltage difference of Vread between the selected word line WLn and the selected bit lines 200 and 210, respectively. The voltage difference of Vread may result in a current flowing through the resistance memory cells RC1 and RC2, respectively. The page buffer 130 of FIG. 1 may determine the memory states of the cells RC1 and RC2, based on the current amounts flowing through the cells RC1 and RC2. For example, when the first cell RC1 has a high resistance state (HRS), the page buffer may detect a small amount of current, determining that the cell RC1 may have a high resistance state. When the second cell RC2 has a low resistance state (LRS), and the page buffer may detect a large amount of current, determining that the cell RC2 may a low resistance state (LRS).

Referring to FIG. 4B, a string selection voltage Vssl may be applied to the second string selection transistor SST2, resulting in current paths between the selected word line WLn and the selected bit lines 200 and 210 through the cells RC3 and RC4, respectively. Under the same bias condition of FIG. 4A except that a string selection voltage Vssl is applied to the string selection transistor SST2, the memory state of the cells RC3 and RC4 may be read out by the page buffer 130.

The bias condition of FIGS. 4A and 4B further includes a read-inhibition voltage Vinhibit that may be applied to unselected word lines WLn-1 and WLn-2 of the selected block 250. However, the inventive concept is not limited thereto. For example, for a selected block, 0V may be applied to unselected word lines WLn-1 and WLn-2. In other embodiments, unselected word lines WLn-1 and WLn-2 may be floated.

For ease of description, FIGS. 4A and 4B shows a selected block having three word lines WLn, WLn-1, and WLn-2 and four string selection transistors SST1 to SST4. However, the numbers of the word lines and the string selection transistors are not limited thereto.

Figure 5A:
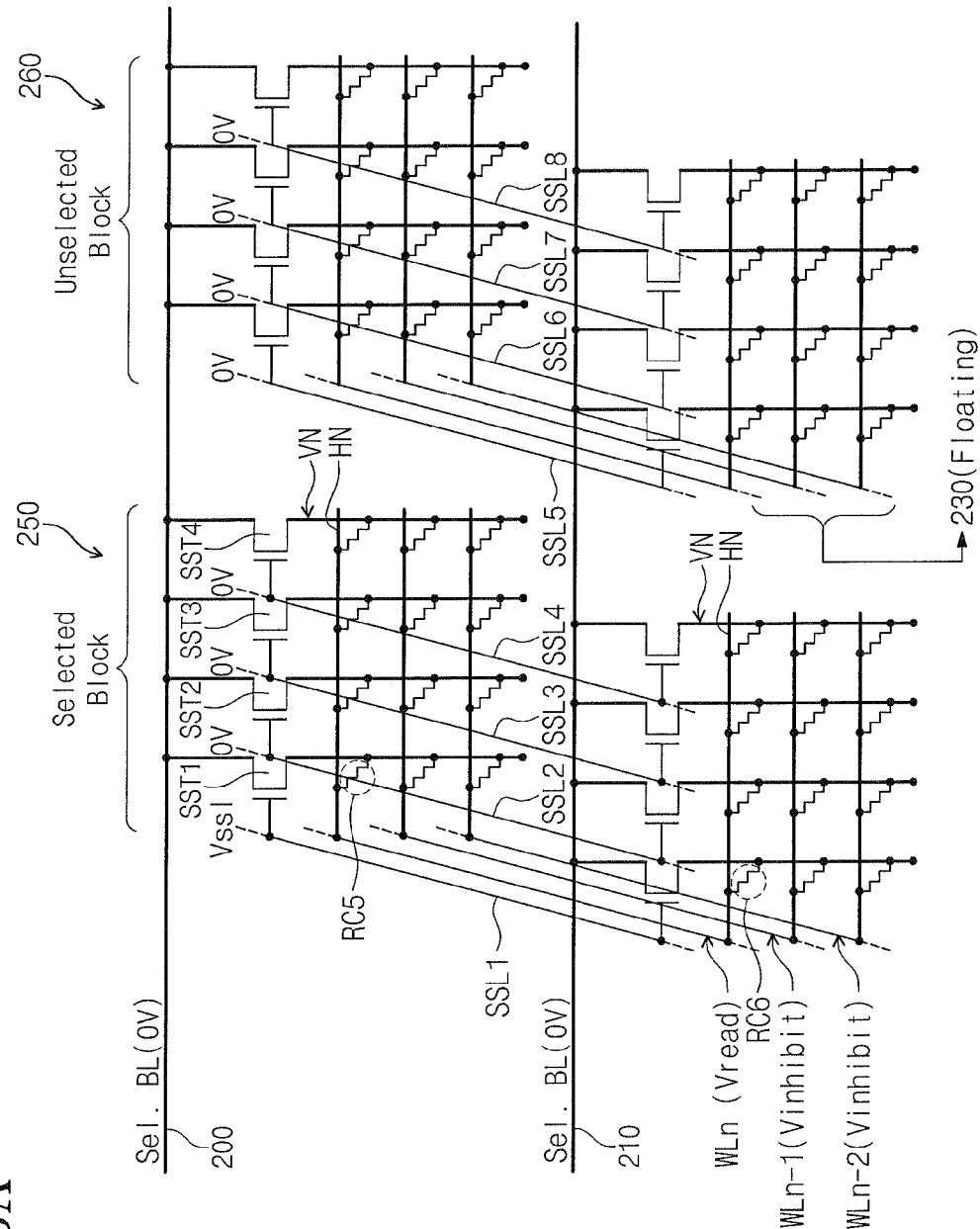
FIGS. 5A and 5B are schematic diagrams for illustrating a sequence of performing in a word line direction by an ABL (All Bit Line)-page.
Figure 5B:
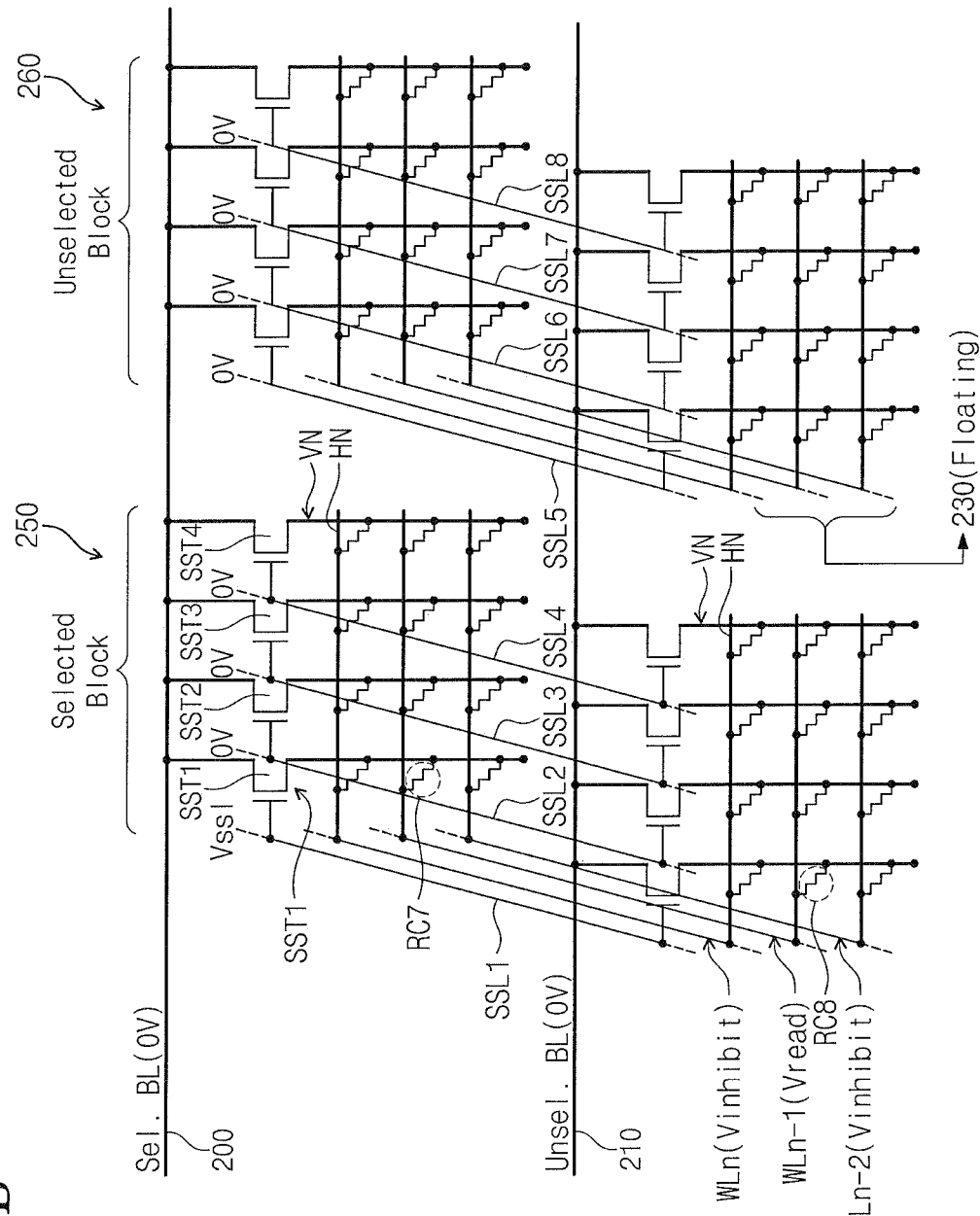

FIGS. 5A and 5B are schematic diagrams for illustrating a sequence of performing in a word line direction by an ABL (All Bit Line)-page. A read bias condition of FIGS. 5A and 5B may be equal to that of FIGS. 4A and 4B. For a read operation performed in a word line direction, a plurality of word lines Wn to Wn-2 may be sequentially selected for a selected string selection line. FIG. 5A shows a bias condition when a first word line Wn is selected for a selected string selection transistor SST1. FIG. 5B shows a bias condition when a second word line WLn-1 is selected for the same string selection transistor SST1. In a sequence of a read operation performed in a word line direction, a third word line WLn-2 is selected for the same string selection transistor SST1.

Referring to FIG. 5A, resistance memory cells RC5 and RC6, connected to a first word line WLn, may be read for a first selection line SSL1. Then, resistance memory cells RC7 and RC8 of FIG. 5B, connected to a second word line WLn-1, may be read for the same selection line SSL1. Herein, the second word line WLn-1 may be disposed at a layer under the first word line WLn in the device 100.

As understood from the above description, a read operation of the inventive concept may be performed in a string direction or a word line direction. In exemplary embodiments, a read operation may be performed in a string direction, and then may be performed in a word line direction. In other example embodiments, a read operation may be performed in a word line direction, and then may be performed a string direction.

Figure 6:
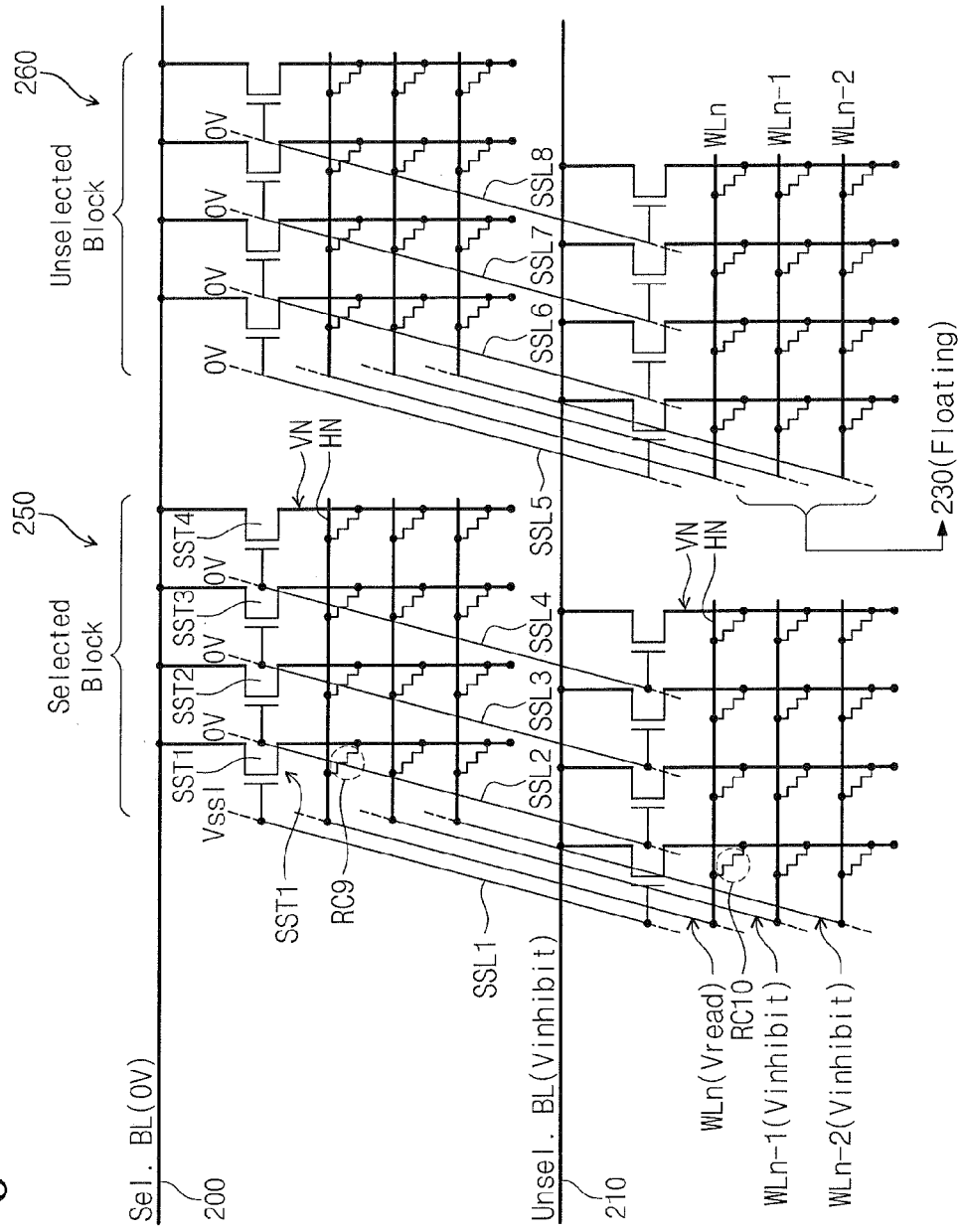
FIG. 6 is a diagram for illustrating a read bias condition of performing a read operation by a PBL (Partial Bit Line)-structured page according to another embodiment of the inventive concept.

FIG. 6 is a diagram for illustrating a read bias condition of performing a read operation by a PBL (Partial Bit Line)-structured page according to another embodiment of the inventive concept. A read bias condition in FIG. 6 may be substantially identical to that of FIG. 4A except that a read-inhibition voltage Vinhibit is applied to an unselected bit line 210 of a selected block 250. When a read-inhibition voltage Vinhibt may be applied to the unselected bit line 210, no current flows along a current path between the unselected bit line 210 and the selected word line WLn. The current path may be formed when a string selection transistor Vssl is applied to a first string selection transistor SST1.

FIGS. 4A to 6 show exemplary embodiments according to the inventive concept that a read-inhibition voltage Vinhibit is provided to unselected word lines of a selected block at a read operation. However, a read operation of the inventive concept is not limited thereto.

Figure 7:
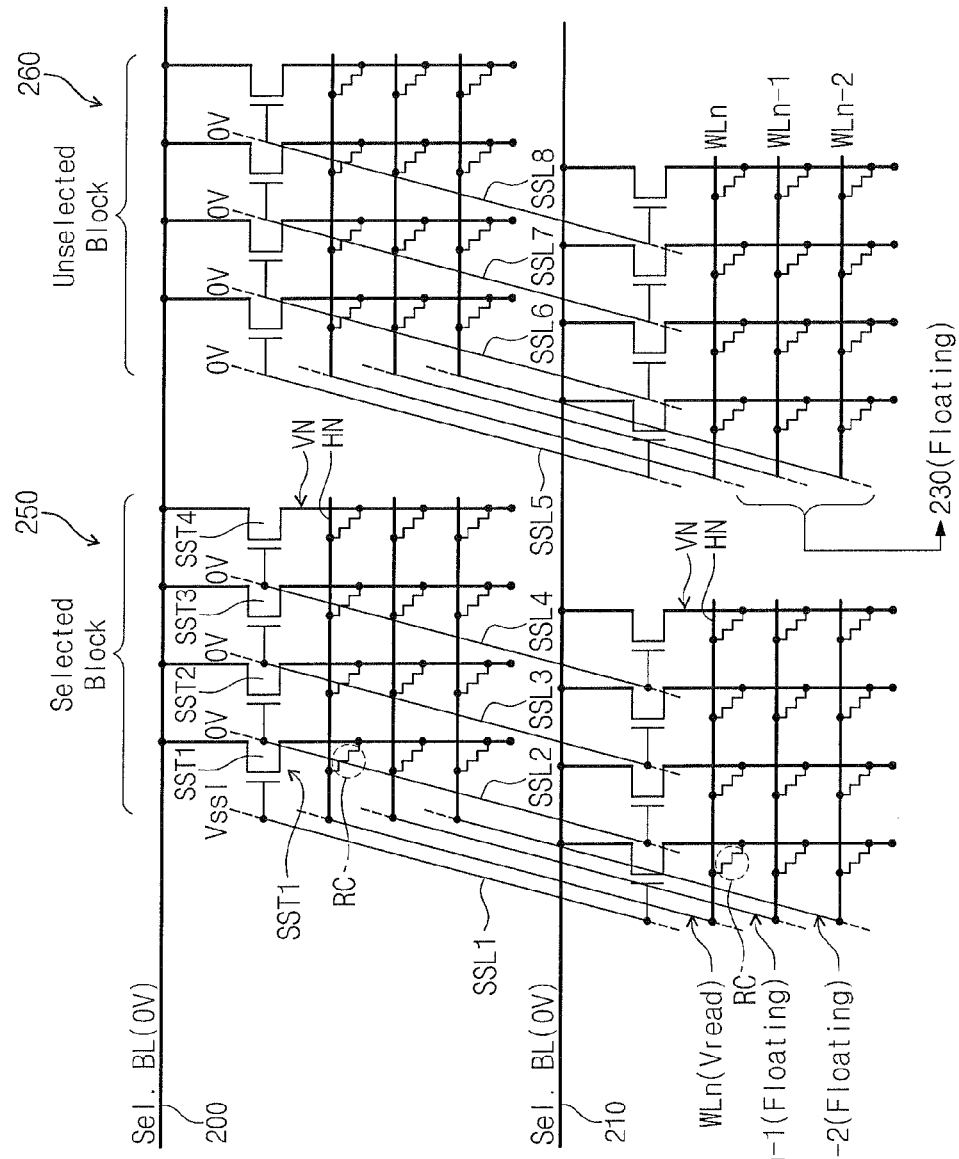
FIG. 7 is a schematic diagram for illustrating a read bias condition according to still another embodiment of the inventive concept.

FIG. 7 is a schematic diagram for illustrating a read bias condition according to still another embodiment of the inventive concept. Referring to FIG. 7, unselected word lines of a selected block may be floated while a read operation is performed to a selected word line for a selected string selection line. The remaining bias condition may be equal to that of FIG. 4A.

Figure 8:
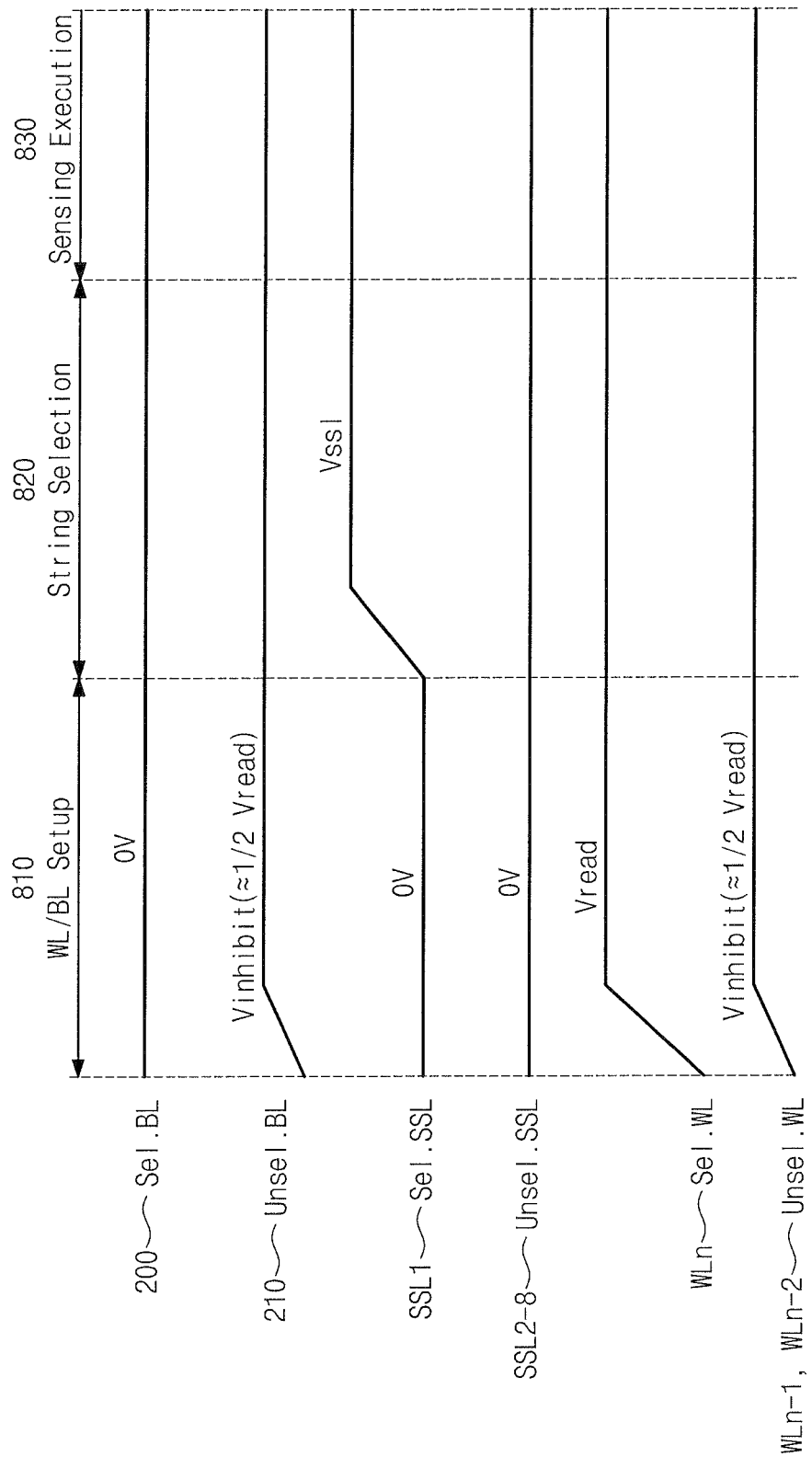
FIG. 8 is a timing diagram of a read operation in a PBL-structured page of FIG. 6 according to the inventive concept.

FIG. 8 is a timing diagram of a read operation in a PBL-structured page of FIG. 6 according to the inventive concept. Referring to FIG. 8, a read operation may include three periods of a word line/bit line setup period 810, a string selection period 820, and a sensing execution period 830. The timing of FIG. 8 applies to the read operation in an ABL-structured page of FIGS. 4A to 5B.

For the word line/bit line setup period 810, 0V may be applied to a selected bit line 200 of FIG. 6, a selected string selection line SSL1, and an unselected string selection line SSL2 to SSL8. A read-inhibition voltage Vinhibit may be applied to an unselected bit line 210 and unselected word line WLn-1 and WLn-2. A read voltage Vread may be applied to a selected word line WLn.

For the string selection period 820, a string selection voltage Vssl may be applied to the selected string selection line SSL1 while 0V remains on the unselected string selection lines SSL2 to SSL8.

For the sensing execution period 830, the page buffer 130 of FIG. 1 may detect a read current flowing from a resistance memory cell RC9 connected to the selected string SSL1 and the selected word line WLn of FIG. 6.

A read operation of the inventive concept may be performed by providing a read voltage Vread to a selected word line, a read-inhibition voltage Vinhibit (about half a read voltage Vread) to an unselected word line and an unselected bit line, and 0V to a selected bit line.

Figure 9:
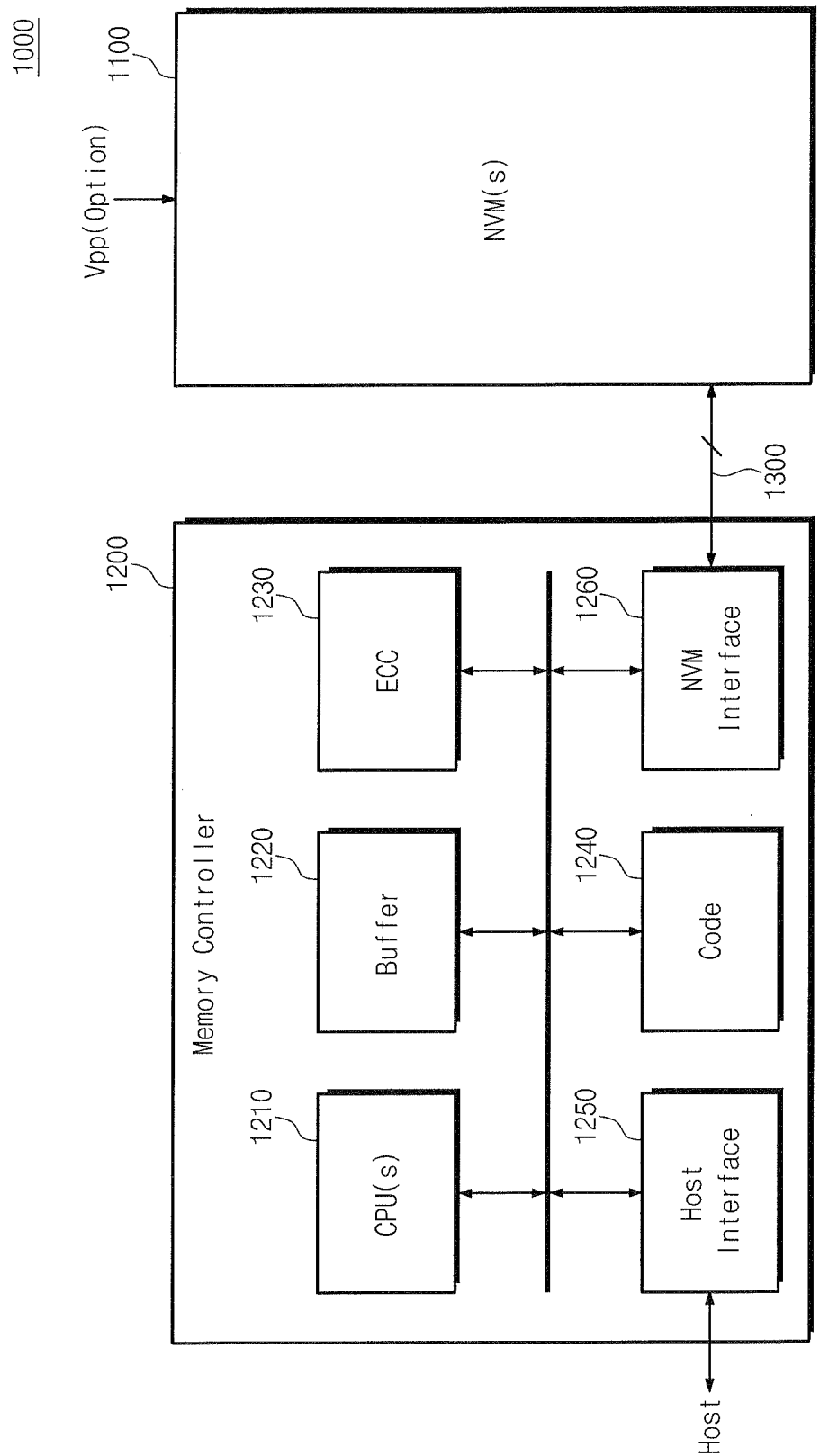
FIG. 9 is a schematic block diagram for illustrating a memory system according to an embodiment of the inventive concept.

FIG. 9 is a schematic block diagram for illustrating a memory system according to an embodiment of the inventive concept. Referring to FIG. 9, a memory system 1000 may include at least one nonvolatile memory device 1100 and a memory controller 1200. The nonvolatile memory device 1100 may be substantially identical to that 100 of FIG. 1.

The nonvolatile memory device 1100 may internally generate a high voltage Vpp. In another embodiment, a high voltage Vpp may be externally supplied to the nonvolatile memory device 1100. The memory controller 1200 may be connected with the nonvolatile memory device 1100 via a plurality of channels 1300. The memory controller 1200 may include at least one Central Processing Unit (CPU) 1210, a buffer memory 1220, an ECC circuit 1230, a code 1240, a host interface 1250, and a memory interface 1260. Although not shown in FIG. 10, the memory controller 1200 may further comprise a randomization circuit that randomizes and de-randomizes data. The memory system 1000 according to an embodiment of the inventive concept is applicable to a perfect page new (PPN) memory.

Detailed description of the memory system is disclosed in U.S. Pat. No. 8,027,194 and U.S. Patent Publication No. 2010/0082890, the entirety of which is hereby incorporated by reference.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A read method of a vertical resistance memory device includinq a plurality of resistance memory cells arranged in a three-dimensional array comprising:
    selecting a block from a plurality of blocks;
    applying a read voltage to a. word line selected from word lines of the block;
    applying a read-inhibition voltage to word lines unselected from the word lines of the block;
    applying a sensing reference voltage toe bit line selected from bit lines sharing the plurality of blocks;
    applying the read-inhibition voltage to bit lines unselected from the bit lines sharing the plurality of blocks;
    applying a string selection voltage to a string selection transistor through a string selection line selected from a plurality of string selection lines of the block, wherein the string selection line is connected to a gate of the string selection transistor;
    applying a ground voltage to string selection transistors through string selection lines unselected from the plurality of string selection lines of the block; and
    determining a memory state of a resistance memory cell selected from the plurality of resistance memory cells by the word line, the bit line and the string selection line based on an amount of current flowing through the resistance memory cell, wherein the word line is connected through a corresponding horizontal electrode to the resistance memory cell,
    wherein the plurality of resistance memory cells is connected between horizontal electrodes and vertical electrodes,
    wherein the horizontal electrodes are formed in XY planes and the vertical electrodes are formed in a direction perpendicular to the XY planes, and
    wherein the horizontal electrodes are connected to the word lines and the vertical electrodes are connected to the bit lines,
    wherein the read-inhibition voltage is half of the read voltage,
    wherein the sensing reference voltage is 0 V,
    wherein the ground voltage is applied to the selected string selection line during a predetermined time before the applying of the string selection voltage.

2. The read method of claim 1, wherein the resistance memory cell includes a variable resistance element having a set state or a reset state determined according to the amount of current flowing through the variable resistance element.

3. The read method of claim 2, wherein the resistance memory cell further includes a diode between the corresponding horizontal electrode and, a corresponding vertical electrode.

4. The read method of claim l, wherein the word lines are formed at a plurality of layers disposed over each other, respectively, and vertical electrodes are disposed in a direction perpendicular to the plurality of layers.

5. The read method of claim 1, wherein the applying of the sensing reference voltage and the determining of the memory state are performed to each of the bit lines.

6. The read method of claim 1, wherein the applying of the sensing reference voltage and the determining of the memory state are performed to each of a portion of the bit lines.

7. The read method of claim 6, further comprising:
    providing the read-inhibition voltage to other bit. lines of the bit. lines 8. The read method of claim 1, wherein string selection. transistors in an unselected block of the plurality of blocks are off states.

9. The read method of claim 8, wherein word, lines of the unselected block are floated.

10. The read method of claim 5, wherein the applying a string selection voltage is sequentially performed to each of the plurality of string selection lines of the block.

11. The read method of claim 5, wherein the applying of the read voltage is sequentially, performed to each of the plurality of word lines of the block.

* * * * *